United States Patent [19]
Lainez et al.

[11] 4,426,122
[45] Jan. 17, 1984

[54] MICROCOMPUTER ADAPTED TO BE CONNECTED TO A SUPPLEMENTARY CIRCUIT PLACED IN A CARTRIDGE

[75] Inventors: Lucien Lainez; Gérard Brandelong, both of Moulins; Marie N. Jacquemin, Yzeure, all of France

[73] Assignee: Thomson-Brandt, Paris, France

[21] Appl. No.: 246,640

[22] Filed: Mar. 23, 1981

[30] Foreign Application Priority Data
Mar. 21, 1980 [FR] France ................. 80 06403

[51] Int. Cl.³ ............................................. H01R 9/09
[52] U.S. Cl. .................. 339/45 M; 339/75 M
[58] Field of Search ............ 339/45 M, 75 R, 75 M, 339/75 MP, 176 MP, 17 CF, 65, 174; 361/395, 399

[56] References Cited
U.S. PATENT DOCUMENTS
3,323,095  5/1967  Bush et al. ...................... 339/18
3,789,345  1/1974  Reimer et al. ................ 339/75 MP

FOREIGN PATENT DOCUMENTS
2341248   9/1977  France .
2408274   1/1979  France .
2021334  11/1979  United Kingdom .......... 339/75 MP

*Primary Examiner*—Neil Abrams
*Attorney, Agent, or Firm*—Oblon, Fisher, Spivak, McClelland & Maier

[57] ABSTRACT

This invention is related to a microcomputer associated to a printed circuit connector adapted to connect main circuits to extension circuits. Said connector comprises pressure means associated to a lid covering an aperture provided in the casing of the microcomputer, which pressure means act on a cartridge containing extension circuits. When said lid is in its closed position, the conductive connecting areas, or contacts, of the printed support circuit associated to said extension circuits are maintained in engagement with conductive elastic blades constituting the connecting contact of the main circuits. The invention is particularly advantageous in the field of microcomputers manufactured and distributed on a large scale.

15 Claims, 5 Drawing Figures

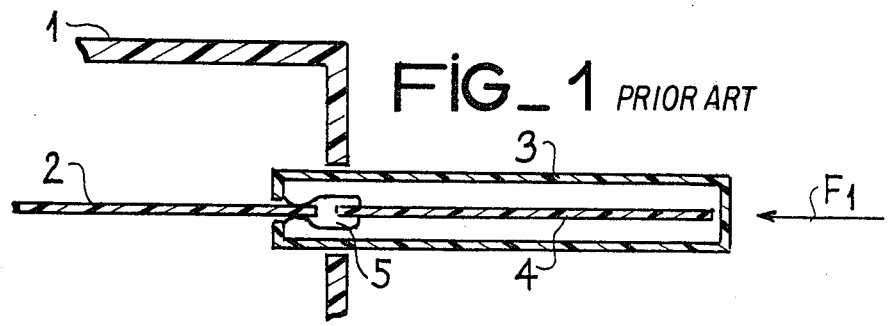
FIG_1 PRIOR ART
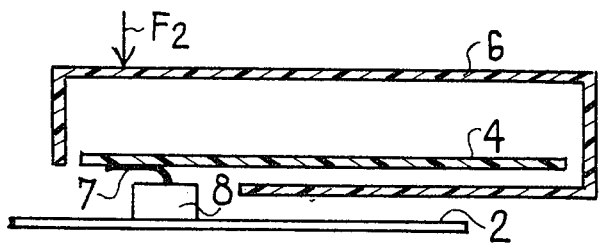
FIG_2
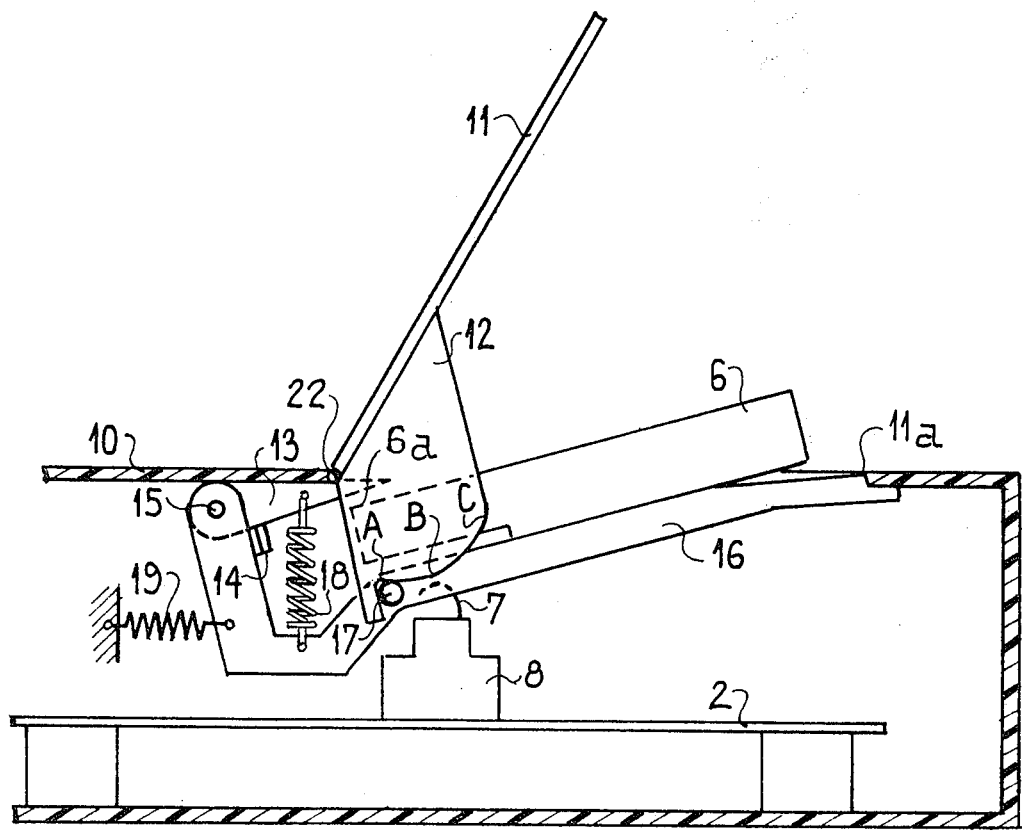
FIG_3

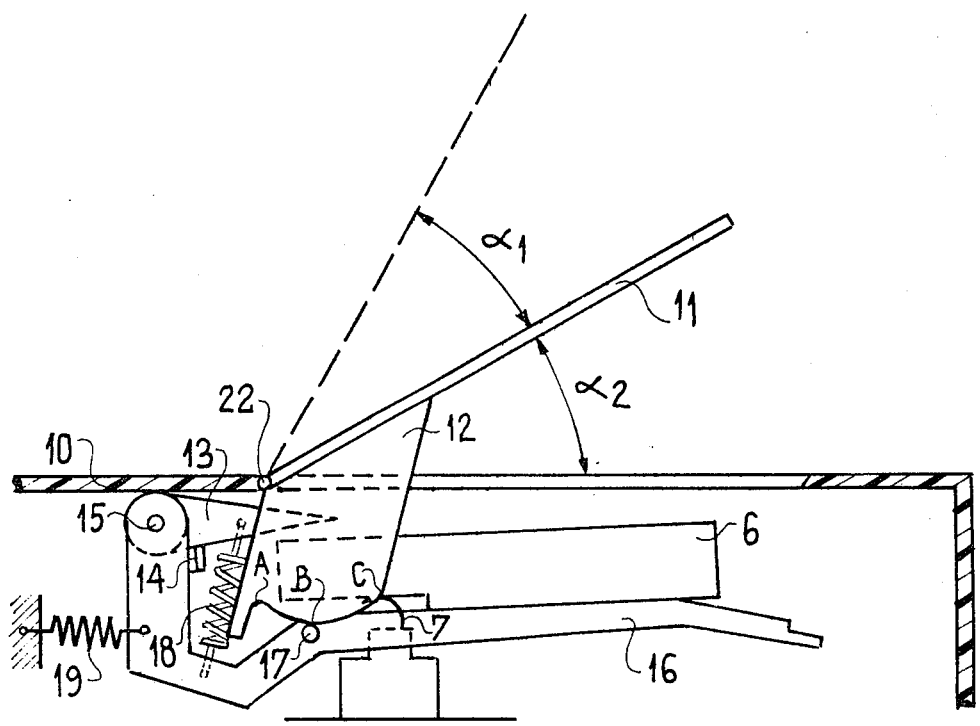
FIG_4
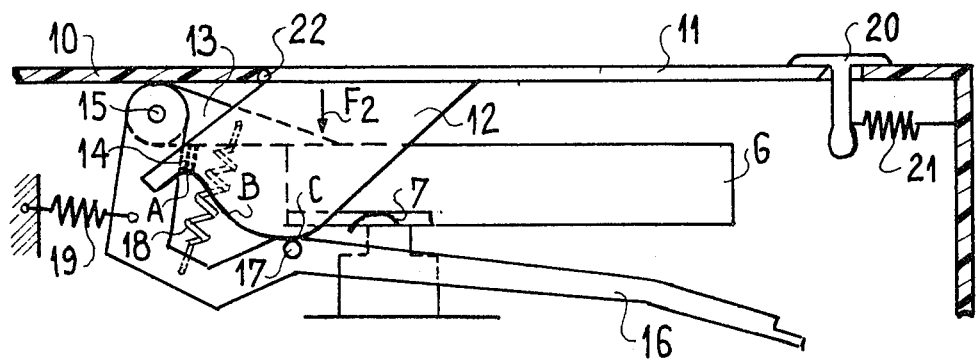
FIG_5

MICROCOMPUTER ADAPTED TO BE CONNECTED TO A SUPPLEMENTARY CIRCUIT PLACED IN A CARTRIDGE

BACKGROUND OF THE DISCLOSURE

The present invention is related to a microcomputer.

More specifically, the invention is related to a microcomputer adapted to be connected to a supplementary circuit placed in a cartridge. In a particular aspect, the invention relates to a printed circuit connecting device for connecting supplementary circuits (or extension circuits) to the main circuit or circuits of such microcomputer, adapted especially to be used in industrial products manufactured for distribution on a large scale.

The potential performances of a microcomputer can be increased, especially in the field of electronic games or calculation, by connecting its main circuits to extension circuits, such as so-called "dead memory circuits".

Such extension circuits are usually arranged within a cartridge or case comprising a slot adapted to receive a plug-in type connecting portion connected to the main circuits of the microcomputer. Fitting (i.e. plugging in) said connecting portion into said slot involves frictional sliding displacement of one connector relative to another connector. Thus such connectors are submitted to substantial wear, and are not adapted to support a great number of connecting and disconnecting operations. Consequently they are particularly ill adapted to be used in products for large scale distribution, since in such products the connectors must be able to resist a large number of connecting and disconnecting operations (about 10,000); furthermore, as the number of connecting zones is comparatively high (about 30), the force required for the plugging-in operation, or introduction, has to be quite considerable (about 20 Newton).

Certain known connectors—so-called "application connectors"—allow these drawbacks to be overcome. When these connectors are used, the supplementary circuits are connected by pressing their contacts against the contacts of the microcomputer circuits. According to a known arrangement of this kind, the cartridges are introduced into a recess provided in a door closing an aperture of the casing of the microcomputer, and the contact is established by the pressure produced when said door is closed.

The present invention is based on the fact that it has been noticed that this last-mentioned type of microcomputer is not well adapted to largescale or mass production. Indeed when the door, the casing or the cartridge are manufactured with large dimensional tolerances—which is preferable in the field of mass production—the forces actually applied may be of great magnitude and thus may result in deformation of the printed circuits.

It is an object of the present invention to overcome this drawback by providing a microcomputer comprising means for limiting the force acting when the connections of the cartridge circuits are applied against the internal contacts while the above-mentioned door is closed.

Other objects, features and advantages of the invention will become apparent in the following illustrative but non-limiting description which refers to the appended drawing.

BRIEF DESCRIPTION OF THE DRAWING

FIG. 1 shows a conventional plug-in connector.

FIG. 2 is a schematical view illustrating the principle of the construction of an application or pressure connector according to the present invention.

FIG. 3 shows a connecting device associated to a microcomputer according to the present invention.

FIGS. 4 and 5 are respective views of the connecting device shown in FIG. 3.

DESCRIPTION OF A PREFERRED EMBODIMENT OF THE INVENTION

FIG. 1 shows a conventional connector. Main circuits 2 of a microcomputer are mounted within a cover or bonnet 1. Extension circuits 4 are arranged within a cartridge or case 3.

The end of the printed circuit comprised in extension circuits 4 is provided with a female connecting assembly 5 comprising a plurality of pairs of juxtaposed spring blades. Cartridge 3 is provided with a slot at one of its ends. Cover or bonnet 1 comprises an aperture through which the slotted end of cartridge 3 can be introduced into cover 1, in such a manner that the end of the printed circuit comprised in main circuits 2 is enabled to penetrate female connecting assembly 5 associated to said extension circuits.

The end of the printed circuit of main circuit 2 is provided with conductive metallic connecting areas each of which engages one pair of the spring blades associated to female connecting assembly (or female connector) 5. The end of said printed circuit thus is clamped by the assembly constituted by the pairs of spring blades of female connecting assembly 5.

The connection is effected manually by applying a translational force $F_1$.

Since a comparatively great number (e.g. about 30) of pairs of spring blades is required, each pair of spring blades constituting a female connecting area, the insertion force $F_1$ has to be high, and said connectors are submitted to rapid wear when the number of connecting and disconnecting operations is elevated.

FIG. 2 is a simplified schematical view of a so-called "application connector".

Extension circuits 4 are mounted within a cartridge 6 the lower portion of which is provided with an aperture.

The lower surface of the printed support circuit of the extension circuits comprises conductive connecting areas. These connecting areas (or contacts) are connected at selected locations of the extension circuits, which locations have to be connected to the main circuits of the microcomputer.

At the upper surface of their printed support circuit, main circuits 2 are provided with a support 8 to which metallic blades 7 are affixed, said blades being bent so as to act as springs when a vertical force is applied thereto. Said blades 7 are electrically connected to circuit 2.

Cartridge 6 containing the extension circuits is positioned above main circuit 2 in such a manner that metallic blades 7 penetrate cartridge 6 through the aperture thereof and engage the conductive areas of the extension circuits. Each one of said blades is connected to a selected location or point of the main circuits and engages a connecting zone, and each one of the connecting zones is thus connected to a selected point or location of the extension circuits. Consequently an electric connection between the extension circuits and the main circuits is thus established.

A vertical application force $F_2$ is applied on the top of cartridge 6, so as to maintain the engagement between the connecting areas of the extension circuits and the spring-like blade 7, whereby, on the one hand, the cartridge is maintained in place and, on the other hand, an efficient electric contact is ensured.

In this construction the electric contact is thus achieved practically without any friction between the mutually engaging portions, whereby the hazard of rapid wear under conditions of very numerous connecting and disconnecting operations is eliminated.

FIG. 3 shows a connecting device according to the instant invention. As shown, the main circuits of the microcomputer are mounted within an associated cover or bonnet 10 which constitutes the casing of the microcomputer.

A door or lid 11 pivotally mounted on an axis 22 is adapted to close an aperture 11a of cover 10. This lid has dimensions at least equal to those of a cartridge 6 containing extension circuits (or supplementary circuits), whereby said cartridge 6 can be introduced into cover or casing 10.

A cam 12 is fixed to the inner surface of lid 11 in such a manner that, when lid 11 rotates about its axis 22 toward the closing position, cam 12 entirely penetrates the inner space of cover or casing 10.

When lid 11 is in its open position, as shown in FIG. 3, cartridge 6 can be introduced into cover 10 so as to be supported by a planar portion of a cartridge support member constituted in the instant embodiment by an angled plate 16. Said angled plate 16 indeed comprises a planar portion adapted to support the cartridge and having dimensions at least equal to those of the latter.

This planar cartridge support portion may be constituted by two parallel arms or by a plate member provided with an aperture arranged in such a manner that the aperture of cartridge 6 is accessible for blades 7 which are bent so as to act as spring blades and which are located under the planar portion of angled plate 16.

The planar cartridge support portion is extended by an angled portion the end of which is hingedly connected to cover or casing 10 by means of an axis 15. Thus said angled plate is enabled to be pivotally moved about axis 15. A lever 13 which is also hingedly connected to cover 10 and able to pivot about axis 15 is positioned immediately beneath the upper wall of cover 10 and maintained by a biased spring 18 mounted between lever 13 and the base of the angled portion of angled plate 16. Lever 13 is locked by means of a stop member 14 integral with said lever and adapted to engage the end of said angled portion of plate 16. Lever 13 is maintained by stop member 14 and biased spring 18 in such a manner that said lever is substantially parallel to the planar portion of angled plate 16.

When cartridge 6 is introduced into cover 10 and placed on the planar portion of angled plate 16 the end of lever 13 is located immediately above the end 6a of cartridge 6 the lower surface of which is provided with the above-mentioned aperture.

Cam 12 integral with door or lid 11 rests on a stop member 17 integral with angled plate 16. Said cam thus transmits to angled plate 16 the force exerted on lid 11 when the latter is being moved to its closed position.

Since lever 13 is connected to angled plate 16 by biased spring 18, cam 12 is enabled to exert on said lever 13 a force, on the one hand, through angled plate 16 and, on the other hand, through biased spring 18.

Blades 7 are positioned in the same manner as in FIG. 2 on a support 8 placed on extension circuits 2.

As shown in FIG. 3, with a view to introducing (or plugging-in) cartridge 6, the latter is positioned, with its aperture directed downwardly, onto the planar portion of angled plate 16. The end of lever 13 then does not engage the cartridge and is located immediately above the same.

FIG. 4 shows a connecting device according to the invention the lid or door of which, indicated at 11, is inclined under an angle $\alpha_1$ substantially equal to the maximum opening angle of said lid 11.

Cam 12 comprises a guiding ramp ABC including two different ramp portions AB and BC.

When lid 11 is pivoted downwardly through an angle $\alpha_1$, the guiding ramp slides on stop member 17 of angled member 16, whereby angled plate 16 and thus cartridge 6 are lowered. When lid 11 is pivoted upwardly through an angle $\alpha_1 + \alpha_2$ stop member 17 is in location A on the guiding ramp, and when the lid is pivoted upwardly (i.e. opened) through an angle $\alpha_2$ stop member 17 is in location B.

This zone AB of the guiding ramp is selected in such a manner that when the lid is pivoted downwardly (closed) through an angle $\alpha_1$ (FIG. 4), the conductive connecting areas of the extension circuits engage blades 7 of the main circuits, while cartridge 6 is supported by angled member 16.

The forces acting during this approach motion are comparatively negligible, and the portion AB of the guiding ramp defines a considerable angle of inclination. Angle $\alpha_1$ may be equal to half the total closing angle (or downward pivoting angle) of lid 11, and the corresponding stroke length of cartridge 6 may be equal to about ⅔ of the total stroke length.

As shown in FIG. 5, lid 11 is completely closed (i.e. moved to its entirely closed position). Stop member 17 which was in location B on the guiding ramp of the cam has moved to location C, so that the connecting areas of the extension circuits press, or squeeze, blades 7.

During this squeezing phase the inclination angle of portion BC of cam 12, i.e. the divergence with reference to a circle centred on arc 22, is small, so as to limit the effort required of the user for closing lid 11.

However, with a view to achieving satisfactory contact or engagement, the force applied to blades 7 must be comparatively elevated (about 20 N). But the dimensions of cover or casing 10 being not perfectly accurate (since cover 10 is comparatively large and usually made of moulded or injection-moulded plastic material), the application force may be too high, being limited only by the flexibility of the related members, and thus may impede the optimum operation of the connecting device. Indeed such exceeding forces may result in a deformation of the printed circuit supporting blades 7, or in a deformation of lid 11.

With a view to overcoming this drawback, biased spring 18 is placed between lever 13 and angled plate 16. Thus, when lid 11 is moved downwardly to its entirely closed position, the end of lever 13 engages the upper part of cartridge 6 and allows a force to be exerted on the latter, which force is substantially constant, whichever the dimensional tolerances may be.

Thus when lid 11 is moved into its closed position lever 13 maintains with the assistance of biased spring 18 a constant force applied to cartridge 6, which results in maintaining the engagement between the connecting areas of the extension circuits and blades 7. Indeed cartridge 6 is then no longer supported by the planar portion of angled plate 16 and is held (or "clamped") between lever 13 and blades 7.

Lid 11 is then locked in its closed position by means of a catch 20 integral with a spring 21.

As shown in FIG. 5 blades 7 are "squeezed" into their extreme position while cartridge 6 engages lever 13. The relative tolerances, dimensional inaccurateness, of cover 10 are compensated by a relative rotational motion of angled plate 16 and lever 13.

By disengaging catch 20 from the front end of lid 11, cartridge 6 can be ejected. To this end an ejection spring 19 affixed to angled plate 16 is compressed when the lid is moved to its closed position, and its expands, thus pushing back plate 16 and consequently cartridge 6 when said lid is set free by disengaging catch 20.

It will be understood that the novel connecting device described herein-above allows extension or supplementary circuits to be connected to the main circuits of an apparatus such as a microcomputer, and allows a great number of connecting and disconnecting operations to be carried out in a simple manner, whereby such connecting device is particularly adapted to be used in apparatus manufactured for distribution on a large scale.

The invention is not limited to the embodiments shown and described herein-above; numerous modifications and variants may be envisaged by those skilled in the art without departing from the spirit and scope of the invention as defined in the appended claims.

What is claimed is:

1. A microcomputer comprising a casing enclosing at least one main circuit and provided with an aperture, a lid pivotally mounted on said casing and movable between an open position wherein said aperture is exposed and a closed position wherein said lid closes said aperture, said aperture being adapted to receive a cartridge enclosing at least one extension circuit adapted to be connected to said main circuit by application under pressure of connecting means associated with said extension circuit onto internal contact means associated with said main circuit, said pressure being applied when said lid is in said closed position, cartridge support means coupled to said casing and movable with respect to said lid for supporting said cartridge, means on said lid whereby motion of said lid between said positions causes said cartridge support to move relative to said lid in a predetermined manner, said microcomputer further comprising pressure limiting means for limiting the magnitude of said pressure applying said connecting means onto said internal contact means, said pressure limiting means acting over a selected range of dimensional tolerances of the cartridge, said pressure limiting means comprising elastic means connected to said cartridge support and adapted to apply, when said lid is in said closed position, a substantially constant force on a surface of said cartridge, which surface is located opposite to a surface thereof which comprises said connecting means.

2. The microcomputer of claim 1, wherein said a cartridge support is adapted to support said cartridge when said lid is in said open position, said support being adapted to be retracted when said lid is moved into said closed position.

3. The microcomputer of claim 1, comprising a pivotally mounted first lever which, when said lid is in said closed position, is applied onto the surface of said cartridge which is opposite to the surface which comprises said connecting means, and wherein said elastic means comprise a spring attached to said first lever and adapted to produce said pressure.

4. The microcomputer of claim 3, wherein one end of said spring is attached to a second lever pivotally mounted on said casing and constituting a support for said cartridge, said means on said lid comprising a cam integral with the internal surface of said lid is adapted to act on said second lever to displace the same when said lid is moved to said closed position.

5. The microcomputer of claim 4, wherein said spring is biased.

6. The microcomputer of claim 4, wherein said spring is attached at one of its ends to said second lever and at its other end to said first lever, said second lever being adapted to receive said cartridge when said lid is in said open position, in such a manner that the surface of said cartridge which comprises said connecting means rests on said second lever.

7. The microcomputer of claim 6, wherein said cam comprises a guiding ramp including a first ramp portion permitting a first displacement of said cartridge support for bringing together said connecting means and said internal contact means, and a second ramp portion permitting a second displacement of said cartridge support for applying said connecting means onto said internal contact means.

8. The microcomputer of claim 7, wherein said first displacement has a magnitude greater than that of said second displacement.

9. The microcomputer of claim 8, wherein said lid is pivotally connected to one edge of said aperture, and wherein said two displacements of said cartridge support correspond respectively to two equal angular displacements of said lid.

10. The microcomputer of any one of claims 2 or 6, wherein said cartridge support comprises two parallel cartridge support portions located on respective sides of said internal contact means.

11. The microcomputer of any one of claims 2 or 6, wherein said cartridge support is constituted by a plate member having an opening through which said internal contact means are adapted to pass.

12. The microcomputer of claim 1, wherein said internal contact means are constituted by elastic blades.

13. The microcomputer of claim 2, comprising a further spring adapted to move said cartridge support pivotally toward said aperture for ejecting said cartridge.

14. The microcomputer of claim 1, wherein said lid is maintained in said closed position by a catch fixed to said casing.

15. The microcomputer of claim 1, wherein said lid and said casing are made of plastic material.

* * * * *